United States Patent
Triyoso et al.

(10) Patent No.: US 7,704,821 B2
(45) Date of Patent: Apr. 27, 2010

(54) IN-SITU NITRIDATION OF HIGH-K DIELECTRICS

(75) Inventors: Dina H. Triyoso, Austin, TX (US); Olubunmi O. Adetutu, Austin, TX (US); Hsing H. Tseng, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 835 days.

(21) Appl. No.: 11/146,826

(22) Filed: Jun. 7, 2005

(65) Prior Publication Data

US 2006/0273411 A1    Dec. 7, 2006

(51) Int. Cl.
*H01L 21/8238* (2006.01)
(52) U.S. Cl. .................... 438/216; 257/325
(58) Field of Classification Search .......... 438/216, 438/287; 257/324, 410, 411, 406, 325
See application file for complete search history.

(56) References Cited

U.S. PATENT DOCUMENTS

| | | | |
|---|---|---|---|
| 5,712,208 A | 1/1998 | Tseng et al. | |
| 5,830,802 A | 11/1998 | Tseng et al. | |
| 6,191,463 B1 | 2/2001 | Mitani et al. | |
| 6,764,898 B1 | 7/2004 | En et al. | |
| 6,875,676 B2 | 4/2005 | Wieczorek et al. | |
| 6,884,685 B2 | 4/2005 | Luo et al. | |
| 2003/0072975 A1* | 4/2003 | Shero et al. | 428/704 |
| 2003/0194853 A1* | 10/2003 | Jeon | 438/591 |
| 2004/0048491 A1* | 3/2004 | Jung et al. | 438/785 |
| 2004/0209487 A1 | 10/2004 | Choi et al. | |
| 2005/0032316 A1 | 2/2005 | Tang et al. | |
| 2005/0110098 A1 | 5/2005 | Yoshihara | |

FOREIGN PATENT DOCUMENTS

WO    WO 2004/044898 A2    5/2004

OTHER PUBLICATIONS

Wolf and Tauber, Silicon Processing, 2000 Lattice Press, vol. 1, pp. 399-403.

* cited by examiner

*Primary Examiner*—W. David Coleman
*Assistant Examiner*—Sonya D McCall-Shepard

(57) ABSTRACT

A semiconductor fabrication process for forming a gate dielectric includes depositing a high-k dielectric stack including incorporating nitrogen into the high-k dielectric stack in-situ. A top high-k dielectric is formed overlying the dielectric stack and the dielectric stack and the top dielectric are annealed. Depositing the dielectric stack includes depositing a plurality of high-k dielectric layers where each layer is formed in a distinct processing step or set of steps. Depositing one of the dielectric layers includes performing a plurality of atomic layer deposition processes to form a plurality of high-k sublayers, wherein each sublayer is a monolayer film. Depositing the plurality of sublayers includes depositing a nitrogen free sublayer and depositing a nitrogen bearing sublayer. Depositing the nitrogen free sublayer includes pulsing an ALD chamber with $HfCl_4$, purging the chamber with an inert, pulsing the chamber with an $H_2O$ or $D_2O$, and purging the chamber with an inert.

13 Claims, 2 Drawing Sheets

IN-SITU NITRIDATION OF HIGH-K DIELECTRICS

FIELD OF THE INVENTION

The invention is in the field of semiconductor fabrication processes and, more particularly, semiconductor fabrication processes that employ high dielectric constant (high-k) films.

RELATED ART

High-k dielectrics are well-known and soon will be widely used in advanced semiconductor fabrication processes. High-k films are suitable for fabrication of dielectric films having a very low effective oxide thickness (EOT), which is a requirement for advanced technologies.

Nitrogen is sometimes introduced into high-k films. Nitridation of high-k dielectrics helps improve device reliability. Currently, the nitridation of high-k dielectric films is performed ex-situ, with respect to the high-k film deposition, using plasma nitrogen. Ex-situ nitridation processes, unfortunately, exhibit poor control of the nitrogen profile in the stack. In some cases, ex-situ nitridation will nitride the entire high-k stack, including the Si/high-k interface. This is undesirable as it leads to increased fixed charge in the dielectric. The use of plasma may also be undesirable as it can lead to plasma induced damage in the dielectric. Ex-situ nitridation is also undesirable as it negatively impact throughput. It would be desirable therefore to implement a controllable and reliable high-k nitridation process.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a process for forming a gate dielectric structure for a semiconductor device uses an impurity such as nitrogen that is incorporated into a high-k dielectric stack in-situ. A thin "pure" (no nitrogen) high-K film is deposited on a wafer substrate. A nitrided high-k stack is then formed over the pure high-k film. The stack may include a number of layers and each layer may include a number of sublayers. In one embodiment, the extent of nitridation is controlled by controlling the number of sublayers in any layer that contain nitrogen and the number of sublayers that do not contain nitrogen. Atomic layer deposition (ALD) is a likely deposition method suitable for use in the invention. Atomic layer deposition techniques permit fine grain control over the layers that are deposited on the wafer and their composition. After the high-k stack is complete, a thin layer of pure high-k may be deposited over the nitrided high-k stack. Finally, a post deposition anneal may be performed to control the nitrogen in the high-k stack. This is better understood with respect to the following drawings and description.

The use of in-situ nitridation process enables the formation of a nitrogen bearing dielectric stack in which the top and bottom interfaces of the dielectric stack are free of nitrogen.

Figure 1:
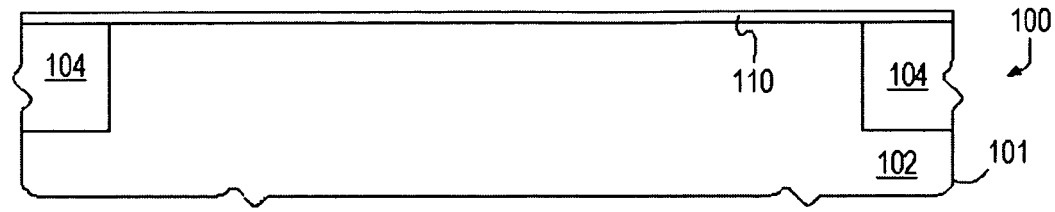
FIG. 1 is a partial cross sectional view of a semiconductor wafer at an intermediate step in the fabrication process in which a monolayer of high-k film is deposited, without nitridation, on a semiconductor substrate.

Turning now to the drawings, FIG. 1 is a partial cross sectional view of a (partially completed) integrated circuit 100 at an intermediate stage in a fabrication process. In FIG. 1, a first high-k layer 110 is formed overlying a substrate 102 of a semiconductor wafer 101. Substrate 102 is preferably crystalline silicon or another suitable semiconductor.

Substrate 102 may be doped with a p-type impurity, an n-type impurity, or both. The portion of substrate 102 visible in FIG. 1 may be part of a semiconductor on insulator wafer 101. In such embodiments, substrate 102 resides over a buried oxide (BOX) layer (not depicted) that lies over a semiconductor bulk portion. Isolation dielectric stacks 104 are shown located within an upper portion of substrate 102. Isolation dielectric stacks 104 provided physical and electrical isolation between adjacent devices or transistors of integrated circuit 100.

In FIG. 1, a first high-k dielectric layer 110 has been formed over substrate 102. For purposes of this disclosure, a high-k dielectric refers to a dielectric having a dielectric constant (k) of at least 8. Representative high-k dielectrics includes various metal-oxide, metal silicate, metal aluminates, and their nitrides as well as silicon nitride and silicon oxynitride or a combination thereof. An exemplary metal oxide high-k material is hafnium oxide (HfO2).

Preferably, first high-k layer 110 does not contain nitrogen. Whereas incorporating nitrogen into a high-k dielectric stack is eventually achieved, first dielectric layer 110 is preferably a nitrogen-free dielectric. A theory is that providing a nitrogen free dielectric at the interface with the underlying substrate beneficially improves the electrical characteristics of the resulting transistor by reducing the amount of fixed charge at the high-k/substrate interface.

Although it is desirable to reduce nitrogen from the substrate interface, it is also desirable to incorporate nitrogen into the bulk of the dielectric stack. Accordingly, the preferred embodiment of first high-k dielectric layer 110 is very thin. Specifically, first high-k dielectric layer 110 is preferably a monolayer, a few monolayers, or sub-layers of the nitrogen-free or low nitrogen high-k material (e.g., $HfO_2$). Formation of monolayer films is achieved with atomic layer deposition (ALD). One implementation of an $HfO_2$ ALD process includes pulsing an ALD chamber (in which the wafer 101 is located) with an metal-halide precursor such as $HfCl_4$ or $ZrCl_4$, to form a monolayer of the precursor on the substrate, and then purging the chamber with an inert species such as $N_2$ and Ar. The chamber is then pulsed with an oxygen-bearing species (the oxidant) and purged. The oxygen reacts with the previously deposited Hf compound to form the high-k material on the substrate. A suitable temperature for this process is approximately 300 C. The oxidant may be $H_2 0$, $O_2$, $O_3$, $N_2O$, NO, or, more preferably, $D_2O$. $D_2O$ is believed to produce more reliable transistors by reducing the transistor's threshold voltage shift characteristics.

Figure 2:
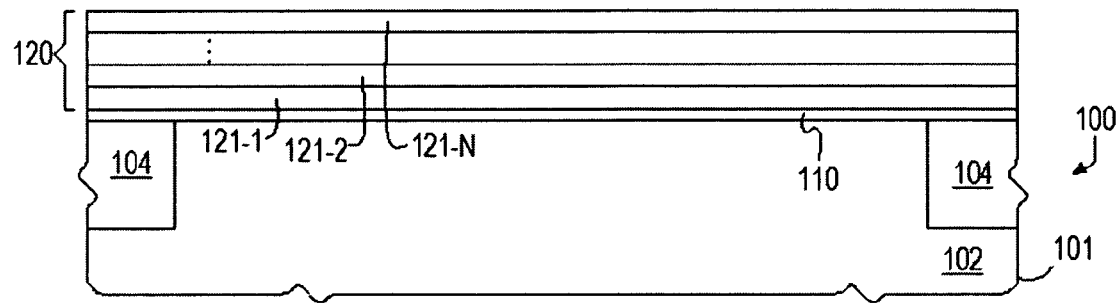
FIG. 2 depicts processing subsequent to FIG. 1 in which a nitridation has been performed on the high-k film.

Referring now to FIG. 2, a nitrided high-k dielectric stack 120 is formed overlying first high-k dielectric layer 110. In the depicted embodiment, high-k dielectric stack 120 includes multiple high-k layers 121-1 through 121-N (generically or collectively referred to as layer(s) 121). The number of high-k layers 121 formed is an implementation detail that depends on the desired thickness of the final film. In one embodiment, each high-k layer 121 is substantially equivalent in terms of its thickness, composition, and deposition process. In other embodiments, the composition of one high-k layer 121 may differ from the composition of another high-k layer 121 and, more specifically, the concentration of nitrogen in one high-k layer 121 may differ from the nitrogen concentration of another high-k layer 121.

Figure 3:
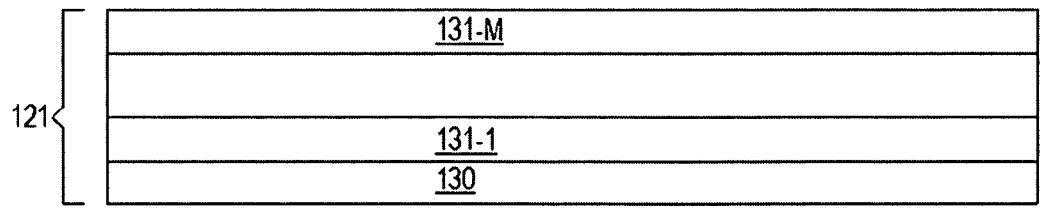
FIG. 3 depicts additional detail of the high-K stack of FIG. 2.

Referring to FIG. 3, additional detail of a high-k layer 121 according to one implementation is shown. In this embodiment, layer 121 includes a first high-k sublayer 130 and one or more subsequent high-k sublayers 131-1 through 131-M (generically or collectively referred to as subsequent sublayer(s) 131). First high-k sublayer 130 and subsequent high-k sublayers 131 may be monolayer films deposited using ALD. In one embodiment, first high-k sublayer 130 is a nitrogen-free sublayer while subsequent high-k sublayers 131 are nitrogen-bearing sublayers. In this embodiment, the relative concentration of nitrogen that is incorporated into high-k dielectric stack 120 is controlled by the number of nitrogen-bearing high-k sublayers 131 in each high-k layer 121. For example, a high-k layer 121 having three nitrogen-bearing high-k sublayers 131 and one nitrogen-free high-k sublayer 130 will have a lower overall concentration of nitrogen than a high-k layer 121 having four nitrogen-bearing high-k sublayers 131 for every nitrogen-free high-k sublayer 130.

Figure 4:
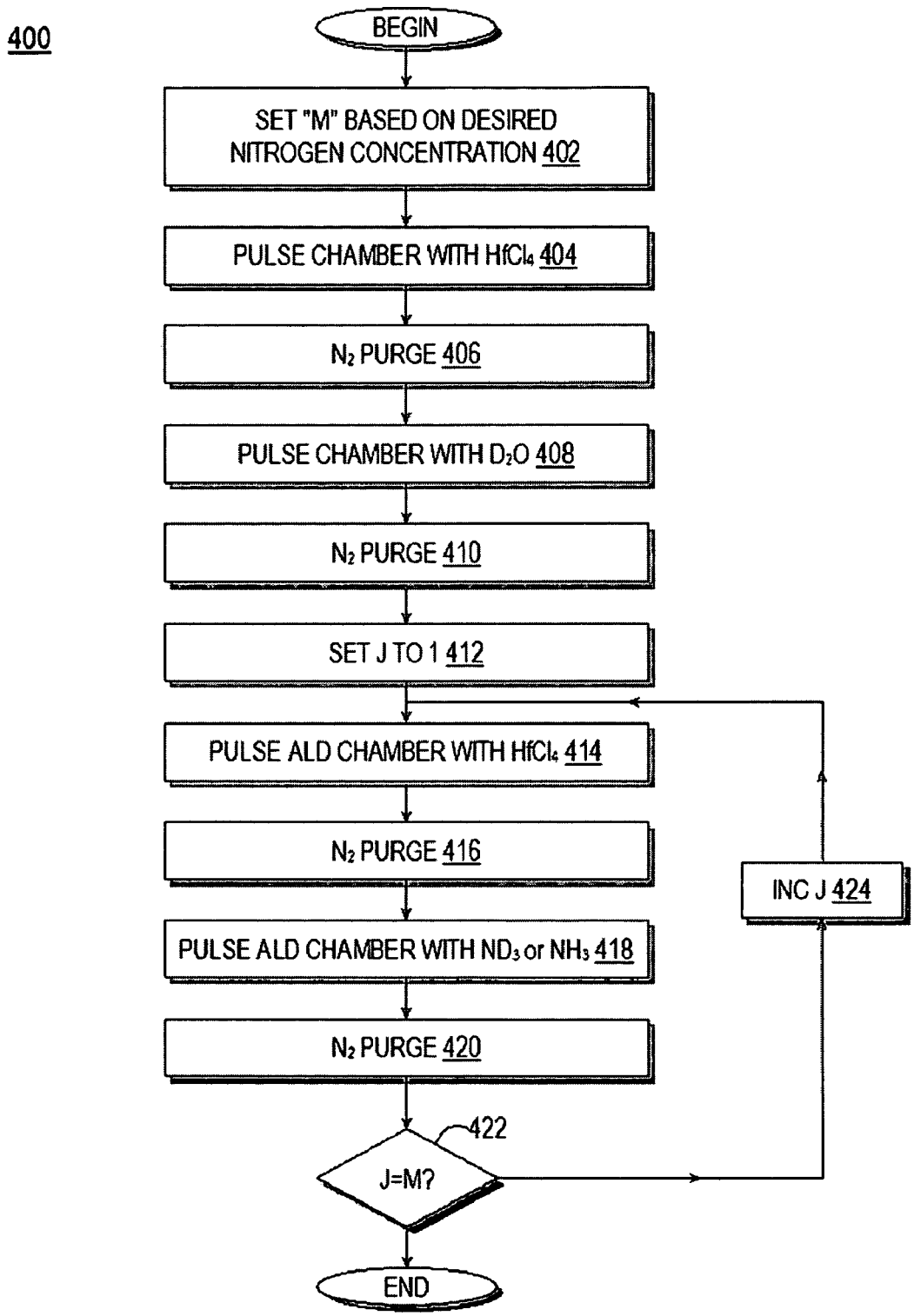
FIG. 4 is a flow diagram representing a process of making the high-K stack of FIG. 2.

Each high-k sublayer 130 and 131 is preferably formed with a distinct set of processing steps. Referring now to FIG. 4, a flow diagram illustrates a process 400 suitable in the formation of a layer 121 of dielectric stack 120. The depicted embodiment of process 400 uses $HfO_2$ as the high-k material and ALD as the basic deposition technique. As referred to above, the concentration of nitrogen in layer 121 of dielectric stack 120 is a function of the number of nitrogen-bearing sublayers 131 in a layer 121. Accordingly, process 400 as depicted in FIG. 4 includes setting or initializing (block 402) the value of a variable (M) based on the amount or concentration of nitrogen that is desired. The variable M determines the number of nitrogen-bearing sublayers 131 in the corresponding layer 121.

After the concentration of nitrogen is determined by initializing the variable M, process 400 as depicted in FIG. 4 includes a sequence (block 404 through block 410) in which the first (nitrogen-free) sublayer 130 is formed. Specifically, formation of a nitrogen free $HfO_2$ is achieved using ALD by pulsing (block 404) the chamber with a Hf-halide compound such as $HfCl_4$ and thereafter purging (block 406) the chamber with $N_2$ or another inert gas. The $HfCl_4$ that was deposited in block 404 is then reactant with an oxidant by pulsing (block 408) the chamber with an oxygen bearing species such as $D_2O$. Other embodiments may use $H_2O$ instead of $D_2O$. After the chamber is pulsed with the oxidant, a reaction takes place to produce $HfO_2$ and an HCl byproduct.

After completing the formation of nitrogen-free sublayer 130, the formation of one or more nitrogen-bearing sublayers is performed. The number of sublayers is determined by a variable (J), which is initialized to 1 in block 412. In the subsequent blocks 414 through 420, a nitrogen bearing sublayer is deposited by pulsing (block 414) an ALD chamber with $HfCl_4$ followed by a $N_2$ purge (block 416). The chamber is then pulsed (block 418) with a nitrogen-bearing species such as $NH_3$, or more preferably, a deuterated nitrogen species such as $ND_3$, which reacts with the previously deposited $HfCl_4$ monolayer to form a monolayer of HfN. A chamber purge (block 420) completes the formation of the monolayer. Process 400 then determines (block 422) whether additional nitrogen-bearing monolayers are required by comparing (block 422) the counter J to the value of M set in block 402. If J<M, the counter is incremented (block 424) and blocks 414 through 420 are repeated. Depending upon the value of M set in block 402, the nitrogen concentration in a layer 121 can be controlled. Typically, the value of M is in the range of approximately 1 to 5 although higher values may be suitable in some applications.

Process 400 is repeated one or more times to form one or more layer 121. In one embodiment, the value of M within process 400 is the same for each layer 121. In this embodiment, each layer 121 in dielectric stack 120 has the same relative concentration of nitrogen. In other embodiments, the value of M may vary with each layer 121 to achieve a precisely controllable, nitrogen concentration distribution.

Figure 5:
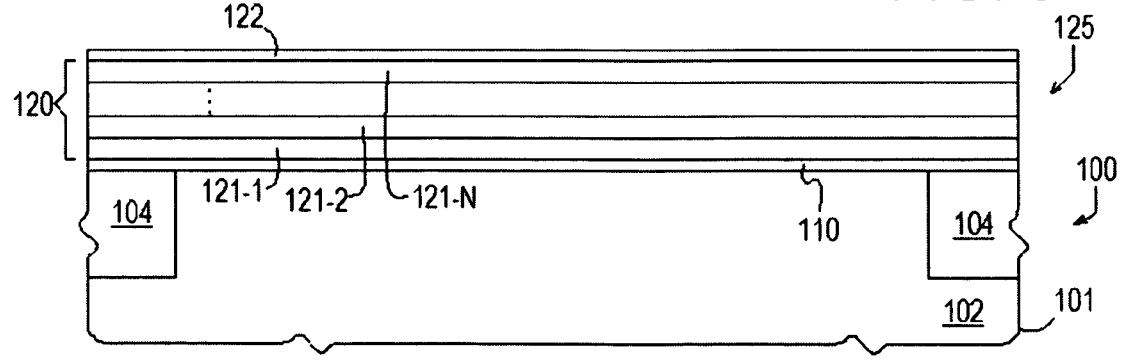
FIG. 5 depicts processing subsequent to FIG. 2.

Referring now to FIG. 5, a top high-k dielectric layer 122 may be deposited overlying dielectric stack 120. Top high-k dielectric layer 122 is preferably a nitrogen free high-k dielectric, that may be substantially equivalent in composition and deposition technique to first high-k layer 110. The inclusion of a nitrogen free top layer 122 is thought to facilitate integration with existing fabrication processing modules because the work function associated with a nitrogen-bearing high-k is different than the work function of the corresponding nitrogen-free high-k. However, if the gate electrode readily reacts with the underlying gate dielectric, the top layer 122 may be a nitrided layer. Following the deposition of top high-k dielectric layer 122, an anneal may be performed to "smooth" the nitrogen profile within dielectric stack 120. The anneal may be implemented with a conventional rapid thermal anneal (RTA). In an implementation suitable for minimizing the diffusion of the nitrogen species in the dielectric, a flash anneal, laser anneal, or the like may be used.

The resulting gate dielectric structure 125 includes first high-k dielectric layer 110, dielectric stack 120, and top high-k dielectric layer 122. Gate dielectric structure 125, as suggested by its name, is suitable for use as a gate dielectric in an MOS transistor. The final effective oxide thickness of gate dielectric structure 125 is preferably less than approximately 2 nm and the physical thickness of gate dielectric structure is less than approximately 4 nm.

In the foregoing specification, the invention has been described with reference to specific embodiments. However, one of ordinary skill in the art appreciates that various modifications and changes can be made without departing from the scope of the present invention as set forth in the claims below. For example, although each layers 110, 121, and 122 have been described as containing the same metal element, other embodiments may employ a different metal elements in different layers. Moreover, the number of sublayers 121, the precursors used in the ALD process may vary from the precursors illustrated in the detailed description. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a nitrided gate dielectric for a transistor, comprising:

depositing a metal oxide high-k film on a semiconductor substrate by pulsing an atomic layer deposition chamber containing the semiconductor substrate with a metal-halide and thereafter pulsing the chamber with an oxidant;

forming a high-k layer overlying the metal oxide high-k film, wherein forming the high-k layer comprises depositing a sublayer consisting of a metal nitride by pulsing the chamber with the metal halide and thereafter pulsing the chamber with $NH_3$ or $ND_3$, the high-k layer comprising a high-k dielectric material having a dielectric constant (k) of at least 8; and selecting a value for M wherein the value represents a desired amount of nitrogen within the high-k layer, and repeating the step of depositing the sublayer until the high-k layer has an amount of nitrogen equal to the value of M.

2. The method of claim 1, wherein the metal oxide film and the sublayer comprise monolayer films.

3. The method of claim 1, wherein the metal halide is HfCl4.

4. The method of claim 1, wherein the oxidant is D2O.

5. The method of claim 1, further comprising purging the chamber with an inert species between said pulsing with the metal halide and said pulsing with the oxidant and purging the chamber with an inert species between said pulsing with the metal halide and said pulsing with the NH3 or ND3.

6. The method of claim 5, further comprising depositing a $HfO_2$ capping layer on the high-k layer.

7. A method for forming a nitrided gate dielectric for a transistor, comprising:

(i) depositing a metal oxide high-k film on a semiconductor substrate by pulsing an atomic layer deposition chamber containing the semiconductor substrate with a metal-halide and thereafter pulsing the chamber with an oxidant;

(ii) selecting a value for a variable M, wherein the value of M is representative of a desired concentration of nitrogen in a high-k layer to be formed, the high-k layer comprising a high-k dielectric material having a dielectric constant (k) of at least 8;

(iii) forming a high-k layer overlying the metal oxide high-k film, wherein forming the high-k layer comprises depositing a sublayer consisting of a metal nitride by pulsing the chamber with the metal halide and thereafter pulsing the chamber with $NH_3$ or $ND_3$ and incrementing the value of a variable J, wherein the variable J represents a count of the number of sublayers formed; and (iv) repeating step (iii) until the value of a variable J is equal to the value of the variable M.

8. The method of claim 7, wherein the metal oxide high-k film and the sublayer comprise monolayer films.

9. The method of claim 7, wherein the metal halide is HfCl4.

10. The method of claim 7, wherein the oxidant is D2O.

11. The method of claim 7, further comprising purging the chamber with an inert species between said pulsing with the metal halide and said pulsing with the oxidant and purging the chamber with an inert species between said pulsing with the metal halide and said pulsing with the NH3 or ND3.

12. The method of claim 11, further comprising depositing a $HfO_2$ capping layer on the high-k layer.

13. A method for forming a nitrided gate dielectric for a transistor, comprising:

(i) depositing a metal oxide high-k film on a semiconductor substrate by pulsing an atomic layer deposition chamber containing the semiconductor substrate with a metal-halide and thereafter pulsing the chamber with an oxidant;

(ii) selecting a value for a variable M, wherein the value of M is representative of a desired concentration of nitrogen in a first high-k layer to be formed, the high-k layer comprising a high-k dielectric material having a dielectric constant (k) of at least 8;

(iii) initializing a variable J to a value of 1, wherein the variable J represents a count of the number of sublayers formed;

(iv) forming a first high-k layer overlying the metal oxide high-k film, wherein forming the first high-k layer comprises depositing a sublayer consisting of a metal nitride by pulsing the chamber with the metal halide and thereafter pulsing the chamber with $NH_3$ or $ND_3$ and incrementing the value of the variable J by 1 after depositing the sublayer; and (v) repeating step (iv) if the value of J is less than the value of the variable M, until the value of the variable J equals the value of the variable M.

* * * * *